United States Patent [19]

Woo

[11] Patent Number: 4,804,926
[45] Date of Patent: Feb. 14, 1989

[54] $F_T$ QUADRUPLER AMPLIFIER WITH LINEARITY CORRECTION

[75] Inventor: James Woo, Portland, Oreg.

[73] Assignee: Tektronix, Inc., Beaverton, Oreg.

[21] Appl. No.: 150,878

[22] Filed: Feb. 1, 1988

[51] Int. Cl.[4] .............................................. H03F 3/45
[52] U.S. Cl. .................................... 330/149; 330/252; 330/311
[58] Field of Search ............... 330/149, 151, 252, 259, 330/260, 261, 295, 311

[56] References Cited

U.S. PATENT DOCUMENTS 4,267,516  5/1981  Traa .................................... 330/149

Primary Examiner—James B. Mullins
Attorney, Agent, or Firm—Peter J. Meza

[57] ABSTRACT

An $f_T$ quadrupler amplifier improves the frequency response beyond that which is possible with an $f_T$ doubler, yet retains precise nonlinearity correction.

Voltage to current conversion is achieved by two parallel differential transconductance signal amplifiers. Two of the inputs of the signal amplifiers are coupled together to form one main differential input, whereas the other two inputs are coupled together and to ground or to a reference voltage. The outputs of the signal amplifiers are cross coupled to form a main differential current output. A parallel differential transconductance error amplifier is provided which senses an error voltage generated by the main signal amplifiers. A corresponding error correction current is generated by the parallel error amplifier and returned to the parallel signal amplifiers. This error correction current substantially reduces nonlinearities in the output current of the signal amplifiers.

10 Claims, 1 Drawing Sheet

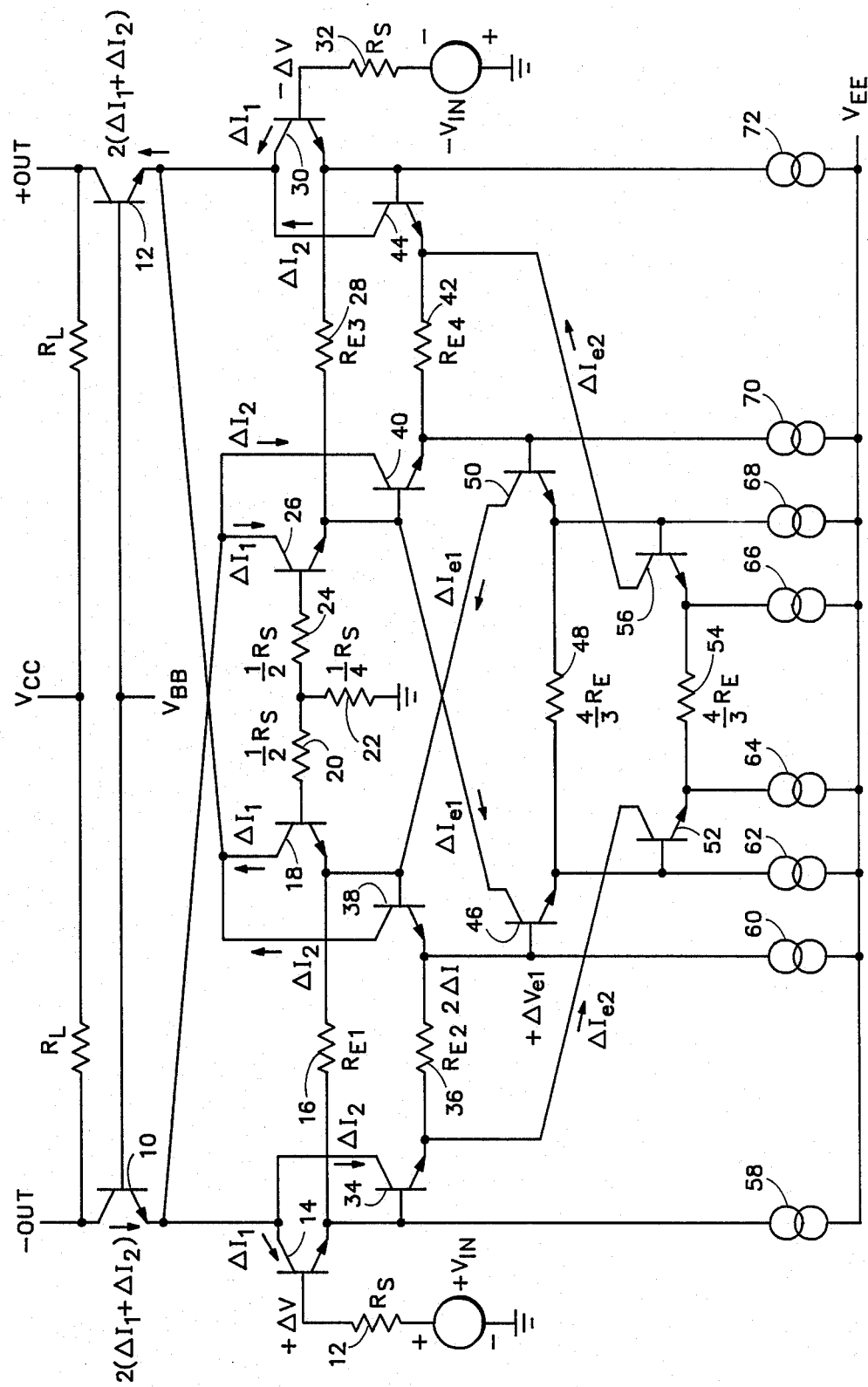

$F_T$ QUADRUPLER AMPLIFIER WITH LINEARITY CORRECTION

BACKGROUND OF THE INVENTION

This invention is in the field of transistorized amplifiers, and relates more specifically to linear differential transconductance amplifiers having enhanced frequency response which have been corrected in some manner to improve linearity.

One approach to improving the frequency response of a differential amplifier is shown in U.S. Pat. No. 3,633,120, entitled "Amplifier Circuit". This has become more commonly known as an "$f_T$ doubler". The name is derived from the operation of the circuit which effectively doubles the current output of the amplifier for the same voltage input, at a given frequency. At high frequencies, when the transistors are in 6 dB per octave rolloff, the $f_T$ doubler will provide the same current output at substantially twice the operating frequency of a single differential pair amplifier.

The $f_T$ doubler as disclosed in the above patent is not compensated for linearity. A circuit which retained the improved frequency response of the original $f_T$ doubler and included a linearity correction circuit was disclosed in U.S. Pat. No. 4,267,516, entitled "Common-Emitter $f_T$ Doubler Amplifier Employing a Feed Foward Amplifier to Reduce Non-Linearities and Thermal Distortion". This circuit included an error amplifier which sensed an error voltage in the main signal amplifier and generated an appropriate error correction current which was summed with the main differential output current to cancel nonlinearities.

However, the demands of the electronics industry have created a need for circuits having increasingly higher speed and precision. Therefore, what is desired is a circuit which provides even more frequency response than the $f_T$ doubler, yet retains precise nonlinearity correction.

SUMMARY OF THE INVENTION

According to the present invention, an $f_T$ quadrupler amplifier is provided which improves the frequency response beyond that which is possible with the $f_T$ doubler, yet retains precise nonlinearity correction.

In a preferred embodiment of the present invention, voltage to current conversion is achieved by two differential transconductance signal amplifiers. Two of the inputs of the signal amplifiers are coupled together to form one main differential input, whereas the other two inputs are coupled together and to ground or to a reference voltage. The outputs of the signal amplifiers are cross coupled to form a main differential current output. A differential transconductance error amplifier is provided which senses an error voltage generated by the main signal amplifiers. A corresponding error correction current is generated by the error amplifier and returned to the signal amplifiers. This error correction current substantially reduces nonlinearities in the output current of the signal amplifiers.

Both the signal amplifiers and the error amplifier have a parallel design. This parallel design includes a first differential pair of transistors whose emitters are coupled through an emitter resistor. A second differential pair of transistors whose emitters are also coupled through a second emitter resistor is coupled to the emitter terminals of the first differential pair. This configuration enables the signal amplifiers to have lower input capacitance for the same gain, to achieve natural peaking in the frequency response, to be fabricated using smaller devices, and to provide for beta loading correction. The same parallel configuration used in the error amplifier provides precise nonlinearity correction without additional bias current.

Circuit analysis demonstrates, and computer simulations confirm, that the $f_T$ quadrupler amplifier of the present invention achieves more than a 35% improvement in bandwidth over the prior art $f_T$ doubler amplifier, while maintaining precise nonlinearity correction without additional bias current.

BRIEF DESCRIPTION OF THE DRAWING

The sole is a schematic diagram of an $f_T$ quadrupler amplifier in accordance with the present invention.

DESCRIPTION OF THE PREFERRED EMBODIMENT

The amplifier circuit according to the present invention is shown in the sole FIGURE. The circuit includes a first parallel signal amplifier which includes transistors 14, 18, 34, and 38, and emitter resistors 16 and 36. The circuit includes a second parallel signal amplifier which includes transistors 26, 30, 40, and 44, and emitter resistors 28 and 42. The base of transistor 14 forms the positive half of the differential voltage input and the base of transistor 30 forms the negative half of the differential voltage input. The collectors of transistors 14, 34, 26, and 40 form the negative half of the differential current output, and the collectors of transistors 18, 38, 30, and 44 form the positive half of the differential current output. The amplifier is driven by a differential voltage source ($+V_{IN}$, $-V_{IN}$), wherein resistors 12 and 32 represent the single ended source impedance. The parallel signal amplifiers are coupled through resistors 20, 22, and 24. Resistor 22 is also coupled to ground or to a DC reference Voltage.

A parallel error amplifier is provided which includes transistors 46, 50, 52, and 56, and emitter resistors 48 and 54. A differential error voltage generated within the two parallel signal amplifiers is sensed by the parallel error amplifier through the bases of transistors 46 and 50. Appropriate error correction currents are returned to the parallel signal amplifiers through the collectors of transistors 46, 50, 52, and 56.

Biasing for the parallel signal amplifiers and the parallel error amplifier is provided by current sources 58, 60, 62, 64, 66, 68, 70, and 72. These current sources may be of any conventional type.

Improvement in bandwidth beyond the prior art $f_T$ doubler amplifier is realized by the parallel nature of the signal amplifiers and, as in the prior art $f_T$ doubler amplifier, from the cross coupling of the outputs. Each parallel signal amplifier includes two differential pairs of transistors coupled through an emitter resistor. With emitter resistors of the same value as the prior art $f_T$ doubler amplifier, it is evident that twice the current will be generated for the same voltage input due to the parallel nature of the signal amplifier. Conversely, if emitter resistors having twice the value of the prior art $f_T$ doubler circuit are used, the same current output will be produced. Thus each transistor in the parallel signal amplifiers may be biased at half the operating current of the prior art $f_T$ doubler amplifier. This reduction in bias current enables smaller transistors to be implemented, with a corresponding reduction in capacitance. Therefore it can be shown that the input capacitance of the present invention is less than that of the prior art $f_T$ doubler amplifier. The expression for input capacitance of a simple differential pair amplifier in which the emitters are coupled through an emitter resistor is:

$$C_{IN} = C_{ob} + 1/(2 * \pi * f_T * (R_E + r_e))$$

$C_{ob}$ is the collector base capacitance of an input device $f_T$ is the unity current gain frequency of an input device $R_E$ is the coupling emitter resistance $r_e$ is the dynamic emitter resistance of an input device In the present invention, the input devices can be smaller than the input devices of the prior art $f_T$ doubler amplifier, therefore $C_{ob}$ is less. The unity gain frequency is the same since the smaller devices are optimally selected to operate with lower current. $R_E$ and $r_e$ are twice the value of that in the prior art $f_T$ doubler. The net result is a substantially decreased value of $C_{IN}$ and an increase in bandwith of the amplifier.

The bandwidth of the amplifier is also increased in another way due to the configuration of the parallel signal amplifiers. Referring again to the sole FIGURE, it should be noted that the input capacitance of the differential amplifier including transistors 34 and 38, and emitter resistor 36 appears directly across emitter resistor 16. The result is that differential amplifier transistors 14 and 18 are coupled through an emitter resistor which is in parallel connection with a capacitor. This parallel connection provides a natural peaking in both parallel signal amplifiers.

The present invention also provides a mechanism for compensating the low frequency beta loading effects of the driving impedances, designated 12 and 32. The beta loading effect causes a nonlinear resistance divider between the driving impedance and the input impedance of the amplifier. As transistor beta varies with temperature, the low frequency input impedance changes. The present invention provides a reduction in the sensitivity of input impedance to beta since the reflected resistances emitter resistors 36 and 42 are in parallel with emitter resistances 16 and 28. The reflected resistances in parallel with emitter resistors 16 and 28 vary directly with beta and produce approximately the same magnitude, but opposite polarity, loading effect as does the input impedance on the driving impedance. Therefore the effects of transistor beta on gain are substantially diminished. Further compensation for changes in beta is found in the compensating resistances 20, 22, and 24. For minimum DC offsets, these resistors are preferrably selected such that the loading impedance on the bases of transistors 18 and 26 is the same as the source impedance of the input transistors 14 and 30. If the single ended source resistance is defined as $R_S$, the corresponding values for resistors 20, 22, and 24 are $R_S/2$, $R_S/4$, and $R_S/2$, respectively.

The present invention further includes an error amplifier for improving the nonlinearity in the output currents in the parallel signal amplifiers. The error amplifier sense the error voltage at the emitters of transistors 18, 26, 38, and 40 of the parallel signal amplifiers and generates appropriate error correction currents which are added to the output signal currents.

For the purpose of simplifying the analysis of the error correction currents, the following assumptions are made. It is assumed that the transistor beta is infinite so that the base current becomes negligible compared to the emitter current and that the transistors are well matched and operate with equal emitter currents. It is further assumed that all emitter resistors labeled $R_E$ are equal, except where appropriately scaled, and that the error signal generated by the parallel error amplifiers is negligible.

As shown in the SOLE FIGURE, the amplifier is symmetrical and is differentially driven by the input signal voltage ($+V_{IN}$, $-V_{IN}$). Thus, the left half of the circuit may be used for the analysis of signal and error correction currents.

Assuming that the parallel signal amplifier has zero $r_e$, the ideal output current is:

(1) $dI_O = (dI_1 + dI_2) = 2dV/R_E$

Assuming that the parallel signal amplifier has non-zero $r_e$, the signal voltage impressed at the bases of transistors 14 and 18 is:

(2) $dV = dI_1 R_{E1} + 2d_{I1} r_e$ (3) $dI_1 = (dV - 2dI_1 r_e)/R_E$

The signal voltage applied at the bases of transistors 34 and 38 is:

(4) $dV_2 = dI_1 R_{E1} = dV - 2dI_1 r_e$ (5) $dI_2 = (dV - 2dI_1 r_e)/(2r_e + R_{E2})$ (6) $dI_2 = (dV - 2dI_1 r_e - 2dI_2 r_e)/R_{E2}$

Therefore, the total output current without the error amplifier is the sum of $dI_1$ and $dI_2$.

(7)
$dI_O = (dV - 2dI_1 r_e)/R_{E1} + (dV - 2dI_1 r_e - 2dI_2)/R_{E2}$

Assuming the $dI_1$ is equal to $dI_2$, the equation for the output current simplifies to:

(8) $dI_O = (2dV - 6dI_1 r_e) R_E$

The second term is the error current in the output signal current generated by the parallel signal amplifier.

An error signal, $dV_e$ appears across the emitter base junctions of transistors 18 and 38 and is sensed by the parallel error amplifier. Thus:

(9) $dV_3 = dI_1 r_e + dI_2 r_e = 2dI_1 r_3$ $$dI_{eT} = dI_{e1} + dI_{e2} = 2(2dI_1 r_e)/(2R_E/3) = 6dI_1 r_e/R_E \quad (10)$$

Thus, the amount of error correction current produced by the parallel error amplifier in equation (10) is equal to the error current generated by the parallel signal amplifier and shown in equation (8).

One important feature of the error correction scheme should be noted. The bias current for the parallel error amplifier is reused in the parallel signal amplifiers, thus greatly reducing the power requirements of the amplifier. For example, current source 62 provides the bias current for transistor 46, in the parallel error amplifier, but also provides the bias current for transistor 26, in one of the parallel signal amplifiers.

As in any integrated circuit, precise matching is desirable to achieve maximum performance. Therefore it is desirable that the following devices be matched: transistors 14, 18, 26, and 30; transistors 34, 38, 40, and 44; transistors 46 and 50; transistors 52 and 56; emitter resistors 16, 28, 36, and 42; and emitter resistors 48 and 54. It is also desirable to match the current sources to minimize second order effects.

Therefore, the $f_T$ quadrupler amplifier includes several advantages over the prior art $f_T$ doubler amplifier. The same current output is achieved at higher bandwidth. Circuit analysis and computer simulations show that the improvement in bandwidth is in excess of 35%. The present invention also provides a mechanism for reducing beta loading effects, and has an error correction scheme which provides first order cancellation of error voltages in the amplifier, but does not add to the power requirements.

While I have shown and described the preferred embodiment of my invention, it will be apparent to those skilled in the art that many changes and modifications may be made without departing from the invention in its broader aspects. The appended claims therefore cover all such changes and modifications as fall therewithin.

I claim:

1. An $f_T$ quadrupler amplifier comprising:
   a. first and second parallel signal amplifier means for converting a differential voltage into a differential current each having first and second inputs and a pair of outputs, the first input of said first amplifier means and the second input of said second amplifier means forming a differential voltage input, the second input of said first amplifier means and the first input of said second amplifier means being coupled together and to a reference voltage source, the output pair of said first amplifier means being cross coupled to the output pair of said second amplifier means to form a differential current output; and
   b. parallel error amplifier means for detecting an error voltage within said first and second parallel signal amplifier means and for providing bias and error cancellation currents thereto.

2. An $f_T$ quadrupler amplifier as in claim 1 further comprising:
   a center tapped resistor for coupling the second input of said first amplifier means to the first input of said second amplifier means, said center tapped resistor having a value substantially equal to one half of the single ended source resistance of an input voltage source; and
   a resistor substantially equal to one quarter of the single ended source resistance, one end being coupled to the center tap, the other end being coupled to a reference voltage.

3. An $f_T$ quadrupler amplifier as in claim 1 further comprising:
   a common base stage having a differential input and a differential output; the differential input being coupled to the differential current output.

4. An $f_T$ quadrupler amplifier as in claim 1 wherein each of said first and second parallel signal amplifier means comprise:
   a first differential amplifier having a differential voltage input, the differential voltage input forming the first and second inputs of each of said first and second parallel signal amplifier means, a differential output, and a pair of emitter terminals for receiving bias and error correction currents; and
   a second differential amplifier having a differential input, a differential output, and a pair of emitter terminals for receiving bias and error correction currents, the differential input being coupled to the emitter terminals of said first differential amplifier, the differential output being coupled to the differential output of said first differential amplifier to form the differential current output of each said first and second parallel signal amplifier means.

5. An $f_T$ quadrupler amplifier as in claim 4 wherein each of said first and second differential amplifiers comprise:
   first and second transistors each having a base, a collector, and an emitter, the bases forming the differential input, the collectors forming the differential output; and
   an emitter resistor coupled between the emitters.

6. An $f_T$ quadrupler amplifier as in claim 5 wherein the parallel error amplifier means comprises:
   a first differential amplifier having a differential voltage input for detecting an error voltage within said first and second parallel signal amplifier means, a differential output for providing said bias and error cancellation currents to said first and second parallel signal amplifier means, and a pair of emitter terminals for receiving bias currents; and
   a second differential amplifier having a differential input, a differential output for providing said bias and error, cancellation currents to said first and second parallel signal amplifier means, and a pair of emitter terminals for receiving bas currents, the differential input being coupled to the emitter terminals of said first differential amplifier.

7. An $f_T$ quadrupler amplifier as in claim 8 wherein each of said first and second differential amplifiers of the parallel error amplifier means comprise:
   first and second transistors each having a base, a collector, and an emitter, the bases forming a differential input, the collectors forming a differential output; and
   an emitter resistor coupled between the emitters, the value of said emitter resistor being substantially equal to four thirds of the value of said emitter resistors of said first and second differential amplifiers of said first and second parallel signal amplifier means.

8. An $f_T$ quadrupler amplifier as in claim 1 wherein the parallel error amplifier means comprises:
   a first differential amplifier having a differential voltage input for detecting an error voltage within said first and second parallel said bias and error cancellation currents to said first and second parallel signal amplifier means, and a pair of emitter terminals for receiving bias currents; and
   a second differential amplifier having a differential input, a differential output for providing said bias and error cancellation currents to said first and second parallel signal amplifier means, and a pair of emitter terminals for receiving bias currents, the differential input being coupled to the emitter terminals of said first differential amplifier.

9. An $f_T$ quadrupler amplifier as in claim 6 wherein each of said first and second differential amplifiers comprise:
   first and second transistors each having a base, a collector, and an emitter, the bases forming the differential input, the collectors forming the differential output; and an emitter resistor coupled between the emitters.

10. An $f_T$ quadrupler amplifier comprising:
a. first and second parallel signal amplifiers each having first and second inputs, a pair of outputs, and first, second, third and fourth emitter terminals, the output pair of said first amplifier being cross coupled to the output pair of said second amplifier to form a differential current output, the first input of said first amplifier and the second input of said amplifier forming a differential voltage input, the second input of said first amplifier being coupled to the first input of said second amplifier and to a reference voltage source; and
b. a parallel error amplifier having first and second inputs, first, second, third, and fourth outputs, and first, second, third, and fourth emitter terminals, the first input being coupled to the third emitter terminal of said first parallel signal amplifier, the second input being coupled to the second emitter terminal of said second parallel signal amplifier, the first output terminal being coupled to the first emitter terminal of said second parallel signal amplifier, the second output terminal being coupled to the second emitter terminal of said first parallel signal amplifier, the third output terminal being coupled to the third emitter terminal of said second parallel signal amplifier, the fourth output terminal being coupled to the fourth emitter terminal of said first parallel signal amplifier; and
c. means for providing a bias current to the first and third emitter terminals of said first parallel signal amplifier, to the second and fourth emitter terminals of said second parallel signal amplifier, and to the first, second, third, and fourth emitter terminals of said error amplifier.

* * * * *